(12) United States Patent
Dor et al.

(10) Patent No.: US 11,438,013 B2
(45) Date of Patent: Sep. 6, 2022

(54) LOW-POWER ERROR CORRECTION CODE COMPUTATION IN GF (2R)

(71) Applicant: SAMSUNG ELECTRONICS CO., LTD., Suwon-si (KR)

(72) Inventors: Avner Dor, Kfar Saba (IL); Amit Berman, Ramat Gan (IL); Ariel Doubchak, Ramat Gan (IL); Elik Almog Sheffi, Ramat Gan (IL); Yaron Shany, Ramat Gan (IL)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 5 days.

(21) Appl. No.: 16/929,983

(22) Filed: Jul. 15, 2020

(65) Prior Publication Data
US 2022/0021401 A1  Jan. 20, 2022

(51) Int. Cl.
*H03M 13/00* (2006.01)
*H03M 13/15* (2006.01)

(52) U.S. Cl.
CPC ..... *H03M 13/157* (2013.01); *H03M 13/6516* (2013.01)

(58) Field of Classification Search
None
See application file for complete search history.

(56) References Cited

U.S. PATENT DOCUMENTS

| | | | | |
|---|---|---|---|---|
| 7,995,757 B2* | 8/2011 | Michaels | ................ | G06F 7/725 |
| | | | | 708/250 |
| 8,139,764 B2* | 3/2012 | Chester | ................ | H04L 9/0668 |
| | | | | 708/492 |

(Continued)

*Primary Examiner* — Mujtaba M Chaudry
(74) *Attorney, Agent, or Firm* — F. Chau & Associates, LLC

(57) ABSTRACT

A method of performing division operations in an error correction code includes the steps of receiving an output $\omega \in F \dagger \{0\}$ wherein $F=GF(2^r)$ is a Galois field of $2^r$ elements, $\omega = \Sigma_{0 \leq i \leq r-1} \beta_i \times \alpha^i$ wherein $\alpha$ is a fixed primitive element of F, and $\beta_i \in GF(2)$, wherein $K=GF(2^s)$ is a subfield of F, and $\{1, \alpha\}$ is a basis of F in a linear subspace of K; choosing a primitive element $\delta \in K$, wherein $\omega = \omega_1 + \alpha \times \omega_2$, $\omega_1 = \Sigma_{0 \leq i \leq s-1} \gamma_i \times \delta^i \in K$, $\omega_2 = \Sigma_{0 \leq i \leq s-1} \gamma_{i+s} \times \delta^i \in K$, and $\gamma = [\gamma_0, \ldots, \gamma_{r-1}]^T \in GF(2)^r$; accessing a first table with $\omega_1$ to obtain $\omega_3 = \omega_1^{-1}$, computing $\omega_2 \times \omega_3$ in field K, accessing a second table with $\omega_2 = \omega_3$ to obtain $(1+\alpha \times \omega_2 \times \omega_3)^{-1} = \omega_4 + \alpha \times \omega_5$, wherein $\omega^{-1} = (\omega_1 \times (1+\alpha \times \omega_2 \times \omega_3))^{-1} = \omega_3 \times (\omega_4 + \alpha \times \omega_5) = \omega_3 \times \omega_4 + \alpha \times \omega_3 \times \omega_5$; and computing products $\omega_3 \times \omega_4$ and $\omega_3 \times \omega_5$ to obtain $\omega^{-1} = \Sigma_{0 \leq i \leq s-1} \theta_i \times \delta^i + \alpha \cdot \Sigma_{i \leq i \leq s-1} \theta_{i+s} = \delta^i$ where $\theta_i \in GF(2)$.

20 Claims, 4 Drawing Sheets

(56) References Cited

U.S. PATENT DOCUMENTS

| | | | | |
|---|---|---|---|---|
| 2005/0149832 A1* | 7/2005 | Liberol | ............... | H03M 13/159 |
| | | | | 714/781 |
| 2012/0014480 A1* | 1/2012 | Gotman | ............ | H03M 13/6525 |
| | | | | 375/340 |
| 2016/0156368 A1* | 6/2016 | Teitel | ....................... | G06F 7/724 |
| | | | | 714/783 |

* cited by examiner (A)

(B)

(C)

LOW-POWER ERROR CORRECTION CODE COMPUTATION IN GF (2R)

BACKGROUND

Technical Field

Embodiments of the present disclosure are directed to the calculation of inverses and logarithms in error correction codes (ECCs).

Discussion of the Related Art

Bose-Chaudhuri-Hocquenghem (BCH), Reed Solomon (RS) and other algebraic ECC decoders perform a relatively small number of discrete division and log operations. Due to the large computational complexity of these operations, they are currently executed with the help of two straightforward permanent lookup tables (LUTs) of size $|F| \times r$ bits each, where $F=GF(2^r)$ is the associated field and $|F|=2^r$.

Let $F=GF(2^r)$ be a Galois field of $2^r$ elements, where r is an integer, and fix $\alpha$, a primitive element of F. A primitive element of a finite field GF(q) where $q=2^r$ is a generator of the multiplicative group of the field, so that each non-zero element of GF(q) can be written as $\alpha^i$ for some integer i. For each $\beta \in F^* \pm F\dagger\{0\}$, define $\log(\beta)=j$ to be the unique integer in $\{0, \ldots, q-2\}$ such that $\alpha^i=\beta$. Note that since the log(0) is undefined, there are q−1 values of the log for the q−1 non-zero elements of F. The standard decoders of RS and BCH perform this operation following the Berlekamp Massey (BM) algorithm. If there are i errors, then t log operations are performed. These decoders also perform an inversion (i.e., division) operation in some implementations of the BM algorithm and in the application of Forney's algorithm to the RS decoder. These are notable examples where log and inversion are used in algebraic ECCs. The overall number of times these operations are performed is typically proportional to the number of errors and erasures. The common practice is to perform these operations with 2 permanent straightforward lookup tables (LUTs), one for the log and the other for inversion. Each of these tables is of size $r \times 2^r$ bits.

Large LUTs are currently being used for a relatively small number of log and inversion operations performed for useful algebraic ECCs. The HW cost is excessive, as a sizable hardware is currently dedicated to these operations. In addition, each performance of an inversion or log requires an access to a large LUT.

SUMMARY

Exemplary embodiments of the present disclosure are directed to systems and methods for performing division and log operations with a few small tables whose overall size is $3.5 \times |F|^{1/2} \times r$ bits, for even r.

According to an embodiment of the disclosure, there is provided a computer implemented method of performing division operations in an error correction code that includes the steps of: receiving an output m of an error correction code (ECC) algorithm, wherein $\omega \in F^*=F\backslash\{0\}$ wherein $F=GF(2^r)$ be a Galois field of $2^r$ elements, $r=2s$, r and s are integers, $\omega=\Sigma_{0 \leq i \leq r-1} \beta_i \times \alpha^i$ wherein $\alpha$ is a fixed primitive element of F, and $\beta_i \in GF(2)$, wherein $K=GF(2^s)$ is a subfield of F, and $\{1, \alpha\}$ is a basis of F in a linear subspace of K; choosing a primitive element $\delta \in K$, wherein $\omega=\omega_1+\alpha \times \omega_2$, $\omega_1=\Sigma_{0 \leq i \leq s-1} \gamma_i \times \delta^i \in K$, $\omega_2=\Sigma_{0 \leq i \leq s-1} \gamma_{i+s} \times \delta^i \in K$, and $\gamma=[\gamma_0, \ldots, \gamma_{r-1}]^T \in GF(2)^2$; accessing a first table with $\omega_1$ to obtain $\omega_3=\omega_1^{-1}$ where $\omega_3 \in K$, and computing $\omega_2 \times \omega_3$ in field K, when $\omega_1 \neq 0$; accessing a second table with $\omega_2=\omega_3$ to obtain $(1+\alpha \times \omega_2 \times \omega_3)^{-1}=\omega_4+\alpha \times \omega_5$, wherein $\omega_4, \omega_5 \in K$, and wherein $\omega^{-1}=(\omega_1 \times (1+\alpha \times \omega_2 \times \omega_3))^{-1}=\omega_3 \times (\omega_4+\alpha \times \omega_5)=\omega_3 \times \omega_4+\alpha \times \omega_3 \times \omega_5$; and computing products $\omega_3 \times \omega_4$ and $\omega_3 \times \omega_5$ in field K to obtain $\omega^{-1}=\Sigma_{0 \leq i \leq s-1} \theta_i \times \delta^i + \alpha \cdot \Sigma_{i \leq i \leq s-1} \theta_{i+s}=\delta^i$ where $\theta_i \in GF(2)$.

According to a further embodiment of the disclosure, $\alpha$ is of minimal hamming weight.

According to a further embodiment of the disclosure, $\delta$ is of minimal hamming weight.

According to a further embodiment of the disclosure, the method includes computing a linear transformation A that transform every $\beta=[\beta_0, \ldots, \beta_{r-1}]^T$ of $GF(2)^r$ to $\gamma=A \times \beta=[\gamma_0, \ldots, \gamma_{r-1}]^T$ of $GF(2)^r$ wherein: $\beta^*=\Sigma_{0 \leq i \leq s-1} \gamma_i \times \delta^i + \alpha \cdot \Sigma_{0 \leq i \leq s-1} \gamma_{i+s} \times \delta^i = \Sigma_{0 \leq i \leq r-1} \beta_i \times \alpha^i$, wherein $\omega=\omega_1+\alpha \times \omega_2$, $\omega_1=\Sigma_{0 \leq i \leq s-1} \gamma_i \times \delta^i \in K$ and $\omega_2=\Sigma_{0 \leq i \leq s-1} \gamma_{i+s} \times \delta^i \in K$, and applying an inverse linear transformation $A^{-1}$ on $\theta=[\theta_0, \ldots, \theta_{r-1}]^T$ wherein $\lambda=A^{-1} \times \theta=[\lambda_0, \ldots, \lambda_{r-1}]^T \in GF(2)^r$ and $\omega^{-1}=\Sigma_{0 \leq i \leq r-1} \lambda_i \times \alpha^i$.

According to a further embodiment of the disclosure, the linear transformation A is computed offline.

According to a further embodiment of the disclosure, the first table $T_1$ is $T_1=\{(\beta,\gamma): \beta=(\beta_0, \ldots, \beta_{s-1}) \in V, \gamma=(\gamma_0, \ldots, \gamma_{s-1}) \in V: \Sigma_{0 \leq i \leq s-1} \gamma_i \times \delta^i = (\Sigma_{0 \leq i \leq s-1} \beta_i \times \delta^i)^{-1}\}$, wherein $V=GF(2)^s$, $W=GF(2)^r$ and $\beta$ is an index of an entry that contains $\gamma$, wherein a size of the first table is $s \times 2^s$.

According to a further embodiment of the disclosure, the second table $T_2$ is $T_2=\{(\beta,\gamma): \beta=(\beta_0, \ldots, \beta_{s-1}) \in V, \gamma=(\gamma_0, \ldots, \gamma_{r-1}) \in W: \Sigma_{0 \leq i \leq s-1} \gamma_i \times \delta^i + \alpha \cdot \Sigma_{0 \leq i \leq s-1} \gamma_{i+s} \times \delta^i = (1+\alpha \cdot \Sigma_{0 \leq i \leq s-1} \beta_i \times \delta^i)^{-1}\}$, wherein $V=GF(2)^s$, $W=GF(2)^r$ and $\beta$ is an index of an entry that contains $\gamma$, wherein a size of the second table is $r \times 2^s$.

According to a further embodiment of the disclosure, the method includes, when $\omega_1=0$, accessing the first table with $\omega_2=\Sigma_{0 \leq i \leq s-1} \gamma_{i+s} \times \delta^i$ to obtain $\theta=(\theta_0, \ldots, \theta_{s-1}) \in V$ such that $\omega_2^{-1}=\Sigma_{0 \cdot i \leq s-1} \theta_i \times \delta^i$; and calculating $\omega^{-1}$ from $\beta \cdot \alpha^{-1}=\Sigma_{0 \leq i \leq r-1} \beta_i \cdot \alpha^{i-1} = \Sigma_{1 \leq i \leq r-1} \beta_i \cdot \alpha^{i-1} + \beta_0 \cdot \Sigma_{0 \leq i \leq r-1} a_{i+1} \cdot \alpha^i$ wherein $\omega^1 = \alpha^{-1} \times \omega_2^{-1}$, wherein $a_i$'s are coefficients of a minimal polynomial of $\alpha$ with a minimal Hamming weight, and $\beta$ is an arbitrary element of $F^*F\backslash\{0\}$.

According to another embodiment of the disclosure, there is provided a computer implemented method of performing log operations in an error correction code that includes the steps of: receiving an output t of an error correction code (ECC) algorithm, wherein $\omega \in F^*=F\backslash\{0\}$ wherein $F=GF(2^r)$ be a Galois field of $2^r$ elements, $r=2s$, r and s are integers, $\omega=\Sigma_{0 \leq i \leq r-1} \beta_i \times \alpha^i$ wherein $\alpha$ is a fixed primitive element of F, and $\beta_i \in GF(2)$, wherein $K=GF(2^s)$ is a subfield of F, and $\{1, \alpha\}$ is a basis of F in a linear subspace of K; choosing a primitive element $\delta \in K$, wherein $\omega=\omega_1+\alpha \times \omega_2$, $\omega_1=\Sigma_{0 \leq i \leq s-1} \gamma_i \times \delta^i \in K$, $\omega_2=\Sigma_{0 \leq i \leq s-1} \gamma_{i+s} \times \delta^i \in K$, and $\gamma=[\gamma_0, \ldots, \gamma_{r-1}]^T \in GF(2)^r$; accessing a first table with $\omega_1$ to obtain $\omega_3=\omega_1^{-1}$ where $\omega_3 \in K$, and computing $\omega_2 \times \omega_3$ in field K, when $\omega_1 \neq 0$; accessing a third table with $\omega_1$ to obtain $\log(\omega_1)$; accessing a fourth table with $1+\alpha \times \omega_2 \times \omega_3$ to obtain $\log(1+\alpha \times \omega_2 \times \omega_3)$; and computing $\log(\omega)=\log(\omega_1 \times (1+\alpha \times \omega_2 \times \omega_1^{-1}))=\mod(q-1, \log(\omega_1)+\log(1+\alpha \times \omega_2 \times \omega_1^{-1}))$.

According to a further embodiment of the disclosure, $\alpha$ is of minimal hamming weight.

According to a further embodiment of the disclosure, $\beta$ is of minimal hamming weight.

According to a further embodiment of the disclosure, the method includes computing a linear transformation A that transform every $\beta=[\beta_0, \ldots, \beta_{r-1}]^T$ of $GF(2)^r$ to $\gamma=A \times \beta=[\gamma_0, \ldots, \gamma_{r-1}]^T$ of $GF(2)^r$ wherein $\beta^*=\Sigma_{0 \leq i \leq s-1} \gamma_i \times \delta^i +$ $\alpha \cdot \Sigma_{0 \leq i \leq s-1} \gamma_{i+s} \times \delta^i = \Sigma_{0 \leq i \leq r-1} \beta_i \times \alpha^i$, wherein $\omega = \omega_1 + \alpha \times \omega_2$, $\omega_1 = \Sigma_{0 \leq i \leq s-1} \gamma_i \times \delta^i \in K$ and $\omega_2 = \Sigma_{0 \leq i \leq s-1} \gamma_{i+s} \times \delta^i \in K$.

According to a further embodiment of the disclosure, the third table $T_3$ is $T_3 = \{(\beta,j): \beta = (\beta_0, \ldots, \beta_{s-1}) \in V, 0 \leq j \leq q-2: j = \log(\Sigma_{0 \leq i \leq s-1} \beta_i \times \delta^i)\}$, wherein $V = GF(2)^s$, and $\beta$ is an index of an entry that contains j, wherein a size of the third table is $r \times 2^s$.

According to a further embodiment of the disclosure, the fourth table $T_4$ is $T_4 = \{(\beta,j): \beta = (\beta_0, \ldots, \beta_{s-1}) \in V, 0 \leq j \leq q-2: j = \log(1 + \alpha \cdot \Sigma_{0 \leq i \leq s-1} \beta_i \times \delta^i)\}$, wherein $V = GF(2)^s$, and $\beta$ is an index of an entry that contains j, wherein a size of the third table is $r \times 2^s$.

According to a further embodiment of the disclosure, the method includes, when $\omega_1 = 0$, and $\omega = \alpha \times \omega_2$, accessing the third table with $\omega_2$ to obtain $j = \log(\omega_2)$, and calculating $\log(\omega) = \log(\alpha \times \omega_2) = \mod(q-1, 1+j)$, wherein $\log(\alpha) = 1$.

According to another embodiment of the disclosure, there is provided a computer implemented method of performing division and log operations in an error correction code that includes the steps of: receiving an output $\omega$ of an error correction code (ECC) algorithm, wherein $\omega \in F^*$ wherein $F = GF(2^r)$ be a Galois field of $2^r$ elements, r is an integer, $\omega = \Sigma_{0 \leq i \leq r-1} \beta_i \times \alpha^i$ wherein $\alpha$ is a primitive element of F and $\beta_i \in GF(2)$; when $\mu(\beta) = 0$, wherein $\mu(\beta) = \min\{0 \leq i \leq r-1: \beta_i = 1\}$, reading $1/\beta$ from a first table and reading $\log(\beta)$ from a second table.

According to a further embodiment of the disclosure, the first table is $T'_1 = \{1/\beta: \beta \in F^* \text{ and } \mu(\beta) = 0\}$, wherein a size of the first table is $|F|/2$.

According to a further embodiment of the disclosure, the second table $T'_2$ is $T'_2 = \{\log(\beta): \beta \in F^*\} \text{ and } \mu(\beta) = 0$, wherein a size of the second table is $|F|/2$.

According to a further embodiment of the disclosure, the method includes, when $\mu(\beta) = s \geq 1$, reading $1/\gamma$ from the first table, wherein $\gamma = \beta/\alpha^s$; and henceforth computing $1/\beta$, applying the equation $1/\beta = \gamma \cdot \alpha^{-s}$, computing $\cdot \alpha^{-1}$ from $\beta \cdot \alpha^{-1} = \Sigma_{0 \leq i \leq r-1} \beta_i \cdot \alpha^{i-1} = \Sigma_{1 \leq i \leq r-1} \beta_i \cdot \alpha^{i+1} + \beta_0 \cdot \Sigma_{0 \leq i \leq r-1} a_{i+1} \cdot \alpha^i$ wherein $\omega^{-1} = \alpha^{-1} \times \omega_2^{-1}$, wherein $a_i$'s are coefficients of a minimal polynomial of $\alpha$ with a minimal Hamming weight, and $\beta$ is an arbitrary element of $F^* = F \setminus \{0\}$.

According to a further embodiment of the disclosure, further comprising, when $\mu(\beta) = s \geq 1$, reading $\log(\gamma)$ from the second table, wherein $\gamma = \beta/\alpha^s$, and calculating $\log(\beta) = \mod(q-1, s+\log(\gamma))$.

DETAILED DESCRIPTION OF EXEMPLARY EMBODIMENTS

Figure 1:
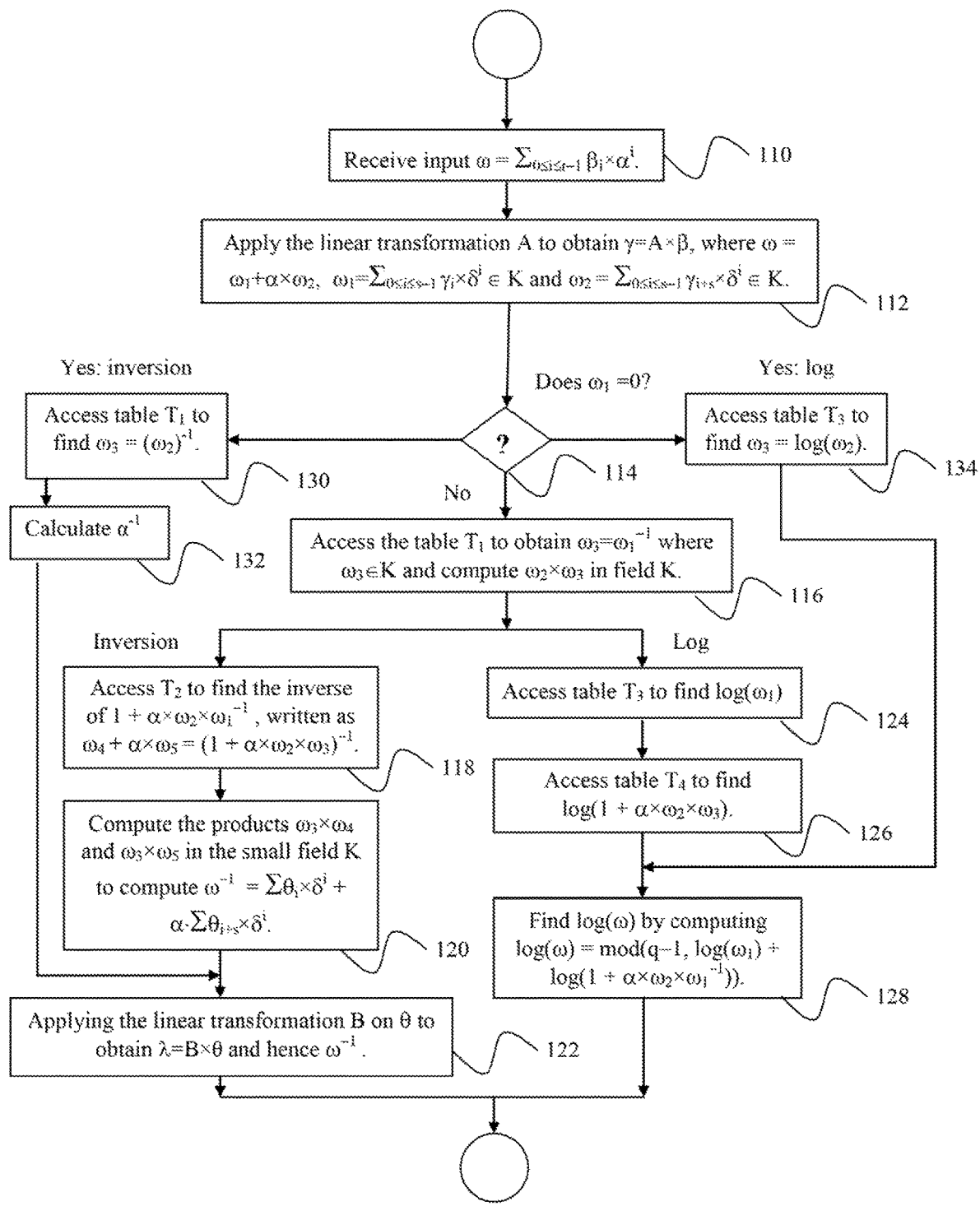
FIG. 1 is a flowchart of an algorithm according to an embodiment for performing division and log operations.

Exemplary embodiments of the disclosure as described herein generally provide systems and methods for performing division and log operations with a few small tables. While embodiments are susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure.

According to an embodiment, a discrete inverse and log operation can be computed with the aid of relatively small tables and relatively small computational complexity, wherein the overall cost of these operation is considerably reduced, in comparison to current practice. According to one embodiment, the overall size of the tables is $3.5 \times |F|^{1/2}$, with a moderate increase of computational complexity per operation. In another embodiment, the overall size of the tables is $|F| = 2^r$ with little added computational complexity. Here F is the associated finite field. In current practice of algebraic ECC implementation, the overall size of both tables is $2 \cdot |F|$. Operations according to embodiments of the disclosure are suitable for low-power 6-bit cell or mobile ECCs.

Embodiments of the present disclosure provide smaller tables for the inverse and log operations at the cost of increased arithmetic complexity per operation. One embodiment is for even r. In this case the overall tables' size is $3.5 \times r \times 2^{r/2}$ bits as opposed to $2 \times r \times 2^r$ in current practice. The resulting computational complexity cost of a single division or a single log operation is not much greater than the complexity of single product operation in the field. Denote by n the code length and by t the number of error after going through the channel. In RS and BCH, there are $O(n^2)$ products and O(t) divisions and log operations. In another embodiment, the tables for the inverse and log are each of half the field size, when there are near zero computations. In this embodiment the computational complexity is relatively negligible. This embodiment is suitable for every r.

Figure 3:
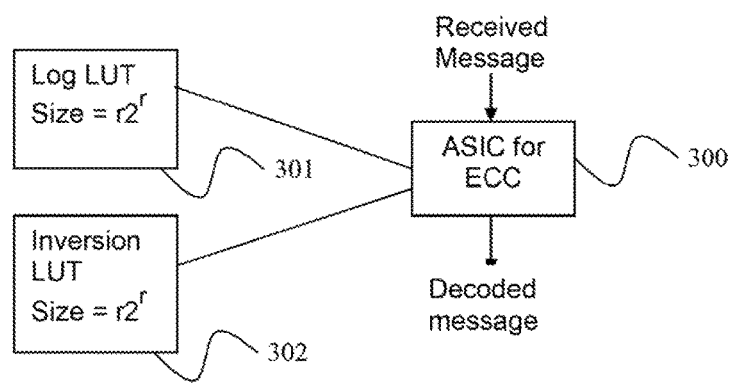
FIG. 3(A) illustrates an ASIC that implements an error correction code with prior art LUTS for the log and inversion operations.
FIGS. 3(B) and 3(C) illustrate an ASIC that implements an error correction algorithm as modified to implement a method for performing division and log operations with a few small tables, according to an embodiment of the disclosure.
Figure 3:
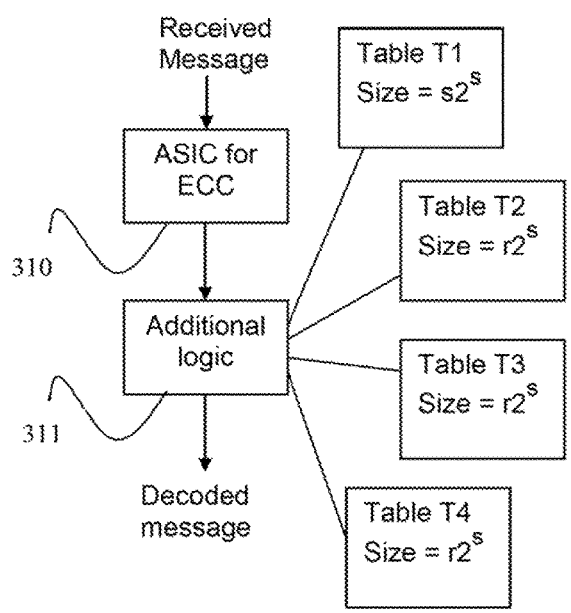
Figure 3:
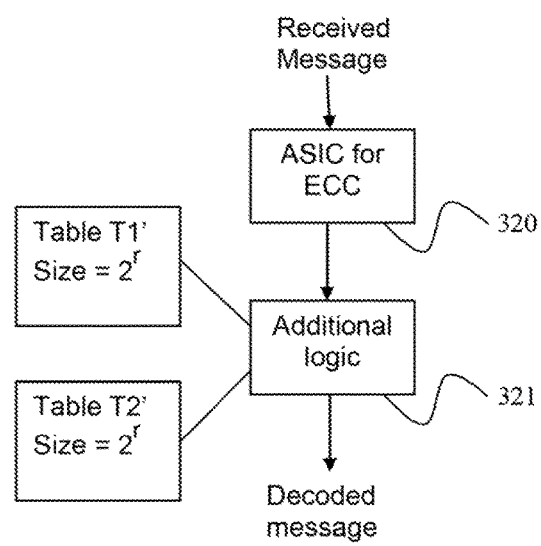

FIG. 3(A) illustrates an ASIC that implements an error correction code with prior art LUTS for the log and inversion operations, and FIGS. 3(B) and 3(C) illustrate an ASIC that implements an error correction algorithm as modified to implement a method for performing division and log operations with a few small tables, according to an embodiment of the disclosure. Referring to FIG. 3(A), error correction code (ECC) ASIC 300 receives a message, performs error correction, accesses tables 301 and 302 for respectively performing log and division operations, and outputs a decoded message. The size of each table is $r \times 2^T$. Referring to FIG. 3(B), error correction code (ECC) ASIC 310 receives a message, performs error correction, and outputs a decoded message. Additional logic 311 performs the log and division operations, and accesses tables T1, T2, T3 and T4 while performing the log and division operations. The size of tables T1, T2, T3 and T4 are, respectively, $s2^s$, $r2^s$, $r2^s$, and $r2^s$, where $r = 2s$. Tables T1, T2, T3 and T4 will be defined below. Referring to FIG. 3(C), error correction code (ECC) ASIC 320 receives a message, performs error correction, and outputs a decoded message. Additional logic 321 performs the log and division operations, and accesses tables T1' and T2' while performing the log and division operations. The size of tables T1' and T2' are, respectively, $2^r$ and $2^r$. Tables T1' and T2' will be defined below.

First Embodiment

Suppose that, $r = 2 \times s$, for positive integer s. Let $F = GF(2^r)$, and $\alpha \in F$ be a primitive element of minimal Hamming weight, where the Hamming weight is the number of one's in the bit representation of $\alpha$. That is, $$p(x) = \sum_{0 \leq i \leq r-1} a_i \times \alpha^i, a_i \in GF(2), \quad (1)$$

is the minimal polynomial of $\alpha$ with minimal hamming weight,
Note that by EQ. (1):

$$\alpha^r = \sum_{0 \leq i \leq r-1} a_i \times \alpha^i \text{ and also } \alpha^{-1} \sum_{0 \leq i \leq r-1+1} a_i \times \alpha^i.$$

Let r'=ham(p(x))−1. It appears that r'=2 would be available in many real world applications. Note that $a_0 = a_r = 1$. Then there are r' nonzero coefficients in the right side of both equations. The fact that this is typically a small number enables us to achieve further complexity reduction. Take now an arbitrary element $\beta \in F^* = F \setminus \{0\}$ and consider its binary representation with respect to the basis of F over GF(2), $\{1, \alpha, \ldots, \alpha^{r-1}\}$:

$$\beta = \sum_{0 \leq i \leq r-1} \beta_i \alpha^i$$

where $\beta_i \in GF(2)$. Define $\text{ham}_\alpha(\beta) = \text{ham}(\beta_0, \ldots, \beta_{r-1})$. Note that $$\beta \cdot \alpha = \sum_{0 \leq i \leq r-1} \beta_i \cdot \alpha^{i+1} = \sum_{0 \leq i \leq r-2} \beta_i \cdot \alpha^{i+1} + \beta_{r-1} \sum_{0 \leq i \leq r-1} a_i \alpha^i. \quad (2)$$

Thus a cyclic shift and r' GF(2) additions are required for the computation of $\beta \cdot \alpha$, when $\beta_{r-1} = 1$ and when $\beta_{r-1} = 0$, for half the fields elements, there are no additions.

Similarly $$\beta \cdot \alpha^{-1} = \sum_{0 \leq i \leq r-1} \beta_i \cdot \alpha^{i-1} = \sum_{1 \leq i \leq r-1} \beta_i \cdot \alpha^{i-1} + \beta_0 \cdot \sum_{0 \leq i \leq r-1} a_{i+1} \beta^i. \quad (3)$$

Hence, here too, a cyclic shift and r' GF(2) additions are required for the computation of $\beta \cdot \beta^{-1}$, when $\beta_0 = 1$ and when $\beta_0 = 0$, for half the fields elements, there are no additions.

For each $\beta \in F^*$, define $\log(\beta) = j$ to be the unique integer in $\{0, \ldots, q-2\}$ such that $\alpha^j = \beta$. A following scheme according to an embodiment proposes reduced size LUTs for inverse and log operations at the cost of increased computational complexity per each inverse or log operation. It embodies a profitable tradeoff of computational complexity vs. hardware.

With the reduced tables according to an embodiment, the complexity cost of a single division or single log operation does not greatly exceed the complexity of single product operation in the field F. In RS and BCH, there are $O(n^2)$ products and O(t) divisions and log operations, where t is the number of errors caused by the channel. The overall tables' size according to an embodiment is $3.5 \times 2^s$ F-symbols as oppose to $2^{r+1}$ in current practice. Consider the field $K = GF(2^s)$ as a subfield of F. Note that [F:K]=2, i.e., |F|=2|K|, and that $\{1, \alpha\}$ is a basis of F over K.

Let $\delta \Sigma K$ be a primitive element of minimal hamming weight. Then, according to an embodiment, an arbitrary element $\tau$ of K can be written with the representation:

$$\tau = \sum_{0 \leq i \leq s-1} \tau_i \times \delta^i, \tau_i \in GF(2). \quad (4)$$

Given this representation, note that the product of two elements from K has ¼ of the complexity of a product in F, and is far easier to implement.

According to an embodiment, an element $\beta^*$ in F can be written uniquely by:

$$\beta^* = \sum_{0 \leq i \leq r-1} \beta_i \times \alpha^i, \beta_i \in GF(2), \quad (5)$$

where r=2×s, as defined above. That is, $\beta^*$ is represented by the basis $\{\alpha^i: 0 \leq i \leq r-1\}$ of F as a linear space over GF(2).

Alternatively, according to an embodiment, similar to EQS. (2) and (3), above, $\beta^*$ can be written uniquely in the form:

$$\beta^* = \sum_{0 \leq i \leq s-1} \gamma_i \times \delta^i + \alpha \cdot \sum_{0 \leq i \leq s-1} \gamma_{i+s} \times \delta^i, \gamma_i \in GF(2). \quad (6)$$

That is, $\beta^*$ is represented by the basis $\{\delta^i, \alpha \times \delta^i : 0 \leq i \leq s-1\}$ of F as a linear space over GF(2). Note that the first term on the right hand size is purely in the field K, while the second term is $\alpha$ multiplied by an element in field K.

Hence, there is an invertible linear transformation over GF(2) that takes $\beta = [\beta_0, \ldots, \beta_{r-1}]^T$ to $\gamma = [\gamma_0, \ldots, \gamma_{r-1}]^T$, when EQS. (2) and (3) hold. This linear transformation can be represented by an r×r matrix $A \in GF(2)^{r \times r}$ such that $A \times \beta = \gamma$. According to an embodiment, matrices A and $B = A^{-1}$ are stored in permanent memory, allocating for this purpose $2 \times r^2$ bits. Note that the matrices are easy to compute, can be precomputed offline and stored in memory, and require relatively little storage as compared to the inverse and log tables that will be introduced below.

According to an embodiment, let $V = GF(2)^s$ and $W = GF(2)^r$. In addition to A and B, the tables stored in memory include the following LUTs: $\{T_i\}_{1 \leq i \leq 4}$. The LUTs are structured so that $\beta$ is the input and $\gamma$ or j are the output. According to an embodiment, $\beta$ is not stored explicitly, but is rather the index of the entry that contains $\gamma$ or j, and is written in the form: $(\beta, \gamma)$ or $(\beta, j)$.

$$T_1 = \{(\beta, \gamma) : \beta = (\beta_0, \ldots, \beta_{s-1}) \in V, \gamma = (\gamma_0, \ldots, \gamma_{s-1}) \in V : \sum_{0 \leq i \leq s-1} \gamma_i \times \delta^i = (\sum_{0 \leq i \leq s-1} \beta_i \times \delta^i)^{-1}\},$$

$$T_2 = \{(\beta, \gamma) : \beta = (\beta_0, \ldots, \beta_{s-1}) \in V, \gamma = (\gamma_0, \ldots, \gamma_{r-1}) \in W : \sum_{0 \leq i \leq s-1} \gamma_i \times \delta^i + \alpha \cdot \sum_{0 \leq i \leq s-1} \gamma_{i+s} \times \delta^i = (1 + \alpha \cdot \sum_{0 \leq i \leq s-1} \beta_i \times \delta^i)^{-1}\},$$

$$T_3 = \{(\beta, j) : \beta = (\beta_0, \ldots, \beta_{s-1}) \in V, 0 \leq j \leq q-2 : j = \log(\sum_{0 \leq i \leq s-1} \beta_i \times \delta^i)\},$$

$$T_4 = \{(\beta, j) : \beta = (\beta_0, \ldots, \beta_{s-1}) \in V, 0 \leq j \leq q-2 : j = \log(1 + \alpha \cdot \sum_{0 \leq i \leq s-1} \beta_i \times \delta^i)\}.$$

For a table T, denote by |T| the number of bits in T. It holds that $|T_1| = s \times 2^s$, $|T_2| = |T_3| = |T_4| = r \times 2^s$.

Preliminary Steps:

FIG. 1 is a flowchart of an algorithm according to an embodiment for performing division and log operations. Referring to the figure, the input of the following procedure, which is an output of an ECC algorithm, received at step 110, is an arbitrary $\omega \in F^*$, which is given by a standard representation of F:

In the following exposition, $\omega_u$, $1 \leq i \leq 5$, is a notation for an element in the small field K. All standard arithmetic operations can be performed in K. A first step 112, according to an embodiment, is to apply the linear transformation A to $\beta = [\beta_0, \ldots, \beta_{r-1}]^T$. The result is $\gamma = [\gamma_0, \ldots, \gamma_{r-1}]^T$, such that, $\gamma = A \times \beta$, which implies:

$$\omega = \omega_1 + \alpha \times \omega^2, \quad (7)$$

which follows from EQ. (6), above, where $\omega_1 = \sum_{0 \leq i \leq s-1} \gamma_i \times \delta^i \in K$ and $\omega_2 = \sum_{0 \leq i \leq s-1} \gamma_{i+s} \times \delta^i \in K$.

At step 114, test for whether $\omega_1 \neq 0$. If $\omega_1 \neq 0$, then, at step 116, by accessing the table $T_1$, a procedure according to an embodiment finds $\omega_3 = \omega_1^{-1}$ where $\omega_3 \in K$ is given by EQ. (1). The procedure then computes the product of $\omega_2 \times \omega_3$ in the small field K, based on the representation of EQ. (1). Note that $$\omega = \omega_1 \times (1 + \alpha = \omega_2 \times \omega_3). \quad (8)$$

Inversion Computation:

According to an embodiment, a next step 118 is to access $T_2$ to find the inverse of $1 + \alpha \times \omega_2 \times \omega_1^{-1}$ written by:

$$\omega_4 + \alpha \times \omega_5 = (1 + \alpha \omega_2 \times \omega_3)^{-1},$$

where $\omega_2 \times \omega_3 \in K$ and $\omega_4$, $\omega_5 \in K$ are given by EQ. (1). Observe that:

$$\omega^{-1}=(\omega_1\times(1+\alpha\times(\omega_2\times\omega_3)))^{-1}=\omega_3\times(\omega_4+\alpha\times\omega_5)=\omega_3\times\omega_4+\alpha\times\omega_3\times\omega_5.$$

At step 120, an inversion procedure according to an embodiment computes the products $\omega_3\times\omega_4$ and $\omega_3\times\omega_5$ in the small field K. Thus of $\omega^{-1}$ has been found in the form of EQ. (3):

$$\omega^{-1}=\Sigma_{0\leq i\leq s-1}\theta_i\times\delta^i+\alpha\cdot\Sigma_{i\leq i\leq s-1}\theta_{i+s}=\delta^i, \theta_i\in GF(2).$$

Applying the linear transformation B on $\theta=[\theta_0, \ldots, \theta_{r-1}]^T$ at step 122, a result $\lambda=[\lambda_0, \ldots, \lambda_{r-1}]^T\in GF(2)^r$ is obtained, such that, $\lambda=B\times\theta$ and hence:

$$\omega^{-1}=\Sigma_{0\leq i\leq r-1}\lambda_i\times\alpha^i.$$

The overall complexity of this inversion procedure is 2 products of a fixed r×r-bit-matrix by r-bit-vectors and 2 table reads and 3 products in the small field K.

According to an embodiment, if, at step 114, $\omega_1=0$, then $\omega=\alpha\times\omega_2$, and hence $\omega^{-1}=\alpha^{-1}\times\omega_2^{-1}$. Recall that EQ. (7) provides the following representation for $\omega_2$:

$$\omega_2=\Sigma_{0\leq i\leq s-1}\gamma_{i+s}\times\delta^i.$$

At step 130, accessing table T, yields $\theta=(\theta_0, \ldots, \theta_{s-1})\in V$ such that $$\omega_2^{-1}\Sigma_{0\leq i\leq s-1}\theta_i\times\delta^i.$$

Next, at step 132, $\alpha^{-1}$ can be calculated from EQ. (3): $\beta\cdot\alpha^{-1}=\Sigma_{0\leq i\leq r-1}\beta_i\cdot\alpha^{i-1}=\Sigma_{1\leq i\leq r-1}\beta_i\cdot\alpha^{i-1}+\beta_0\cdot\Sigma_{0\leq i\leq r-1}a_{i+1}\cdot\alpha^i$, so that $\omega^1=\alpha^{-1}\times\omega_2^{-1}$.

Log Computation:

Suppose again that EQ. (4) is computed so that $\{\omega_i\}_{1\leq i\leq 3}$ is already computed wherein $\omega_3=\omega_1^{311}$ and $\omega_2\times\omega_3$ is computed, and $\omega=\omega_1\times(1+\alpha\times\omega_2\times\omega_3)$. A log algorithm according to an embodiment proceeds by transitioning to step 124 after step 116, instead of transitioning to step 118. At step 124, table $T_3$ is accessed to find $\log(\omega_1)$ and table $T_4$ is accessed at step 126 to find $\log(1+\alpha\times\omega_2\times\omega_3)$. Finally, at step 128, the log of w is found by computing $$\log(\omega)=\log(\omega_1\times(1+\alpha\times\omega_2\times\omega_1^{-1}))=\mathrm{mod}(q-1, \log(\omega_1)+\log(1+\alpha\times\omega_2\times\omega_1^{-1})),$$

where the mod(q−1, *) reflects the q−1 non-zero elements in the field.

According to an embodiment, if, at step 114, $\omega_1=0$, then $\omega=\alpha\times\omega_2$, and a simplified version of the above can be performed. In particular, at step 134, table $T_3$ can be accessed to find $\omega_3=\log(\omega_2)$, after which a procedure according to an embodiment jumps to step 128 to compute $\log(\omega)=\log(\alpha\times\omega_2)=\mathrm{mod}(q-1, 1+\omega_3)$, where $\log(\alpha)=1$

Alternative Embodiment

Embodiments of the disclosure also provide a scheme for inverse and log operations with tables of half the field size and very small computational cost per log or inverse operation. These operations are suitable for any finite field of characteristic 2, i.e., a finite field $GF(2^r)$.

Figure 2:
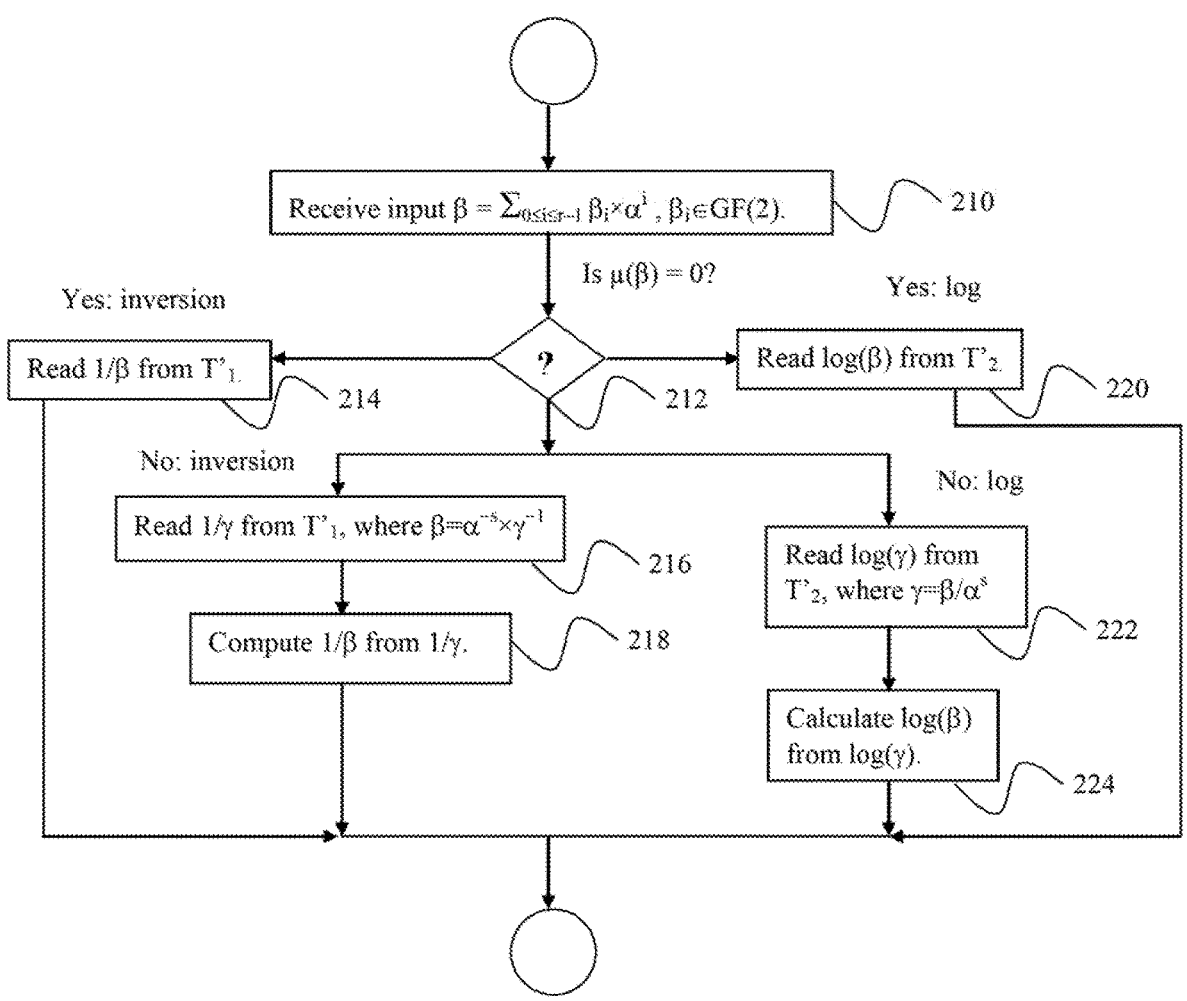
FIG. 2 is a flowchart of an algorithm according to another embodiment for performing division and log operations.

FIG. 2 is a flowchart of an algorithm according to another embodiment for performing division and log operations. According to an embodiment, let $F=GF(2^r)$, and a be a fixed root of a primitive polynomial of degree r, $p(x)=\Sigma_{0\leq i\leq r}a_i\times x^i$, $a_i\in GF(2)$, whose hamming weight is minimal. Let r'=ham (p(x))−1, the number of 1-bits. This number should be as small as possible. Referring to the figure, the input of the following procedure, which is an output of an ECC algorithm, received at step 210, is $\beta\in F^*$ and consider the standard binary representation:

$$\beta=\Sigma_{0\leq i\leq r-1}\beta_i\times\alpha^i, \beta_i\in GF(2).$$

Define $$\mu(\beta)=\min\{0\leq i\leq r-1: \beta_i=1\},$$

which is the index of the first 1-bit in $\beta$.

According to an embodiment, the following table is stored:

$$T'_1=\{1/\beta:\beta\in F^* \text{ and } \mu(\beta)=0\}$$

which is the first bit in $\beta$.

Since the first bit of $\beta$ is 1, i.e., $\beta_0=1$, the size of the table is reduced by 2, so it holds that: $|T'_1|=|F|/2$. Noting that when $\beta_0=1$, the address of $1/\beta$ on the table is given by $(\beta_1, \ldots, \beta_{r-1})$. Let $\beta\in F^*$. If, at step 212, $\mu(\beta)=0$, then $1/\beta$ can be read from $T_1$ at step 224, and hence in this case no is computations are needed. Otherwise, $\mu(\beta)=s\geq 1$. Let $\gamma=\beta/\alpha^s\in T'_1$ and note that $\mu(\gamma)=0$. Thus $1/\gamma$ is in $T'_1$. Now, $\beta=\alpha^{-s}\times\gamma^{-1}$ and hence, $1/\gamma$ can be read from $T_1$ at step 216.

Note that a repetitive application of EQ. (2) provides a computation of the scalars $\{\beta\cdot\alpha^i\}_{1\leq i\leq N}$ where $N\geq 1$ with at most N·r' GF(2) additions and an average over all $\beta\in F$ of N·r'/2 additions. Likewise it follows from EQ. (3) that the scalars $\{\beta\cdot\alpha^{-i}\}_{i\leq i\leq N}$ can be computed with at most N·r' GF(2) additions and an average over all $\beta\in F$ of N·r'/2 additions. Thus, $1/\beta$ can be computed at step 218, with s×r'/2 XORs, in a straightforward manner, applying the aforementioned recursion. Noting that for r>s≥0, $\Pr(\mu(\beta)=s)<2^{-(s+1)}$, it holds that that on average there are fewer than r'/2 XORs to find $1/\beta$ for random $\beta\in F^*$.

Similarly, for the log operation, the following table is stored:

$$T'_2=\{\log(\beta):\beta\in F^* \text{ and } \mu(\beta)=0\}.$$

Similar to $T'_1$, it then holds that $|T'_2|=|F|/2$. Let $\beta\in F^*$. If $\mu(\beta)=0$ at step 212, $\log(\beta)$ can be read from $T'_2$ at step 220. Otherwise, $\mu(\beta)=s\geq 1$. Then, $\gamma=\beta/\alpha^s\in T'_2$ and hence $\log(\gamma)$ can be read from $T'_2$ at step 222, from which the $\log(\beta)$ can be calculated at step 224:

$$\log(\beta)=\mathrm{mod}(q-1, s+\log(\gamma)).$$

Observe that $\log(\beta)=\log(\gamma)+s$, when $\log(\gamma)+s\leq q-2$ and $\log(\beta)=\log(\gamma)+s-(q-2)$ when $\log(\gamma)+s>q-2$.

System Implementations

It is to be understood that embodiments of the present disclosure can be implemented in various forms of hardware, software, firmware, special purpose processes, or a combination thereof. In one embodiment, the present disclosure can be implemented in hardware as an application-specific integrated circuit (ASIC), or as a field programmable gate array (FPGA). In another embodiment, the present disclosure can be implemented in software as an application program tangible embodied on a computer readable program storage device. The application program can be uploaded to, and executed by, a machine comprising any suitable architecture.

Figure 4:
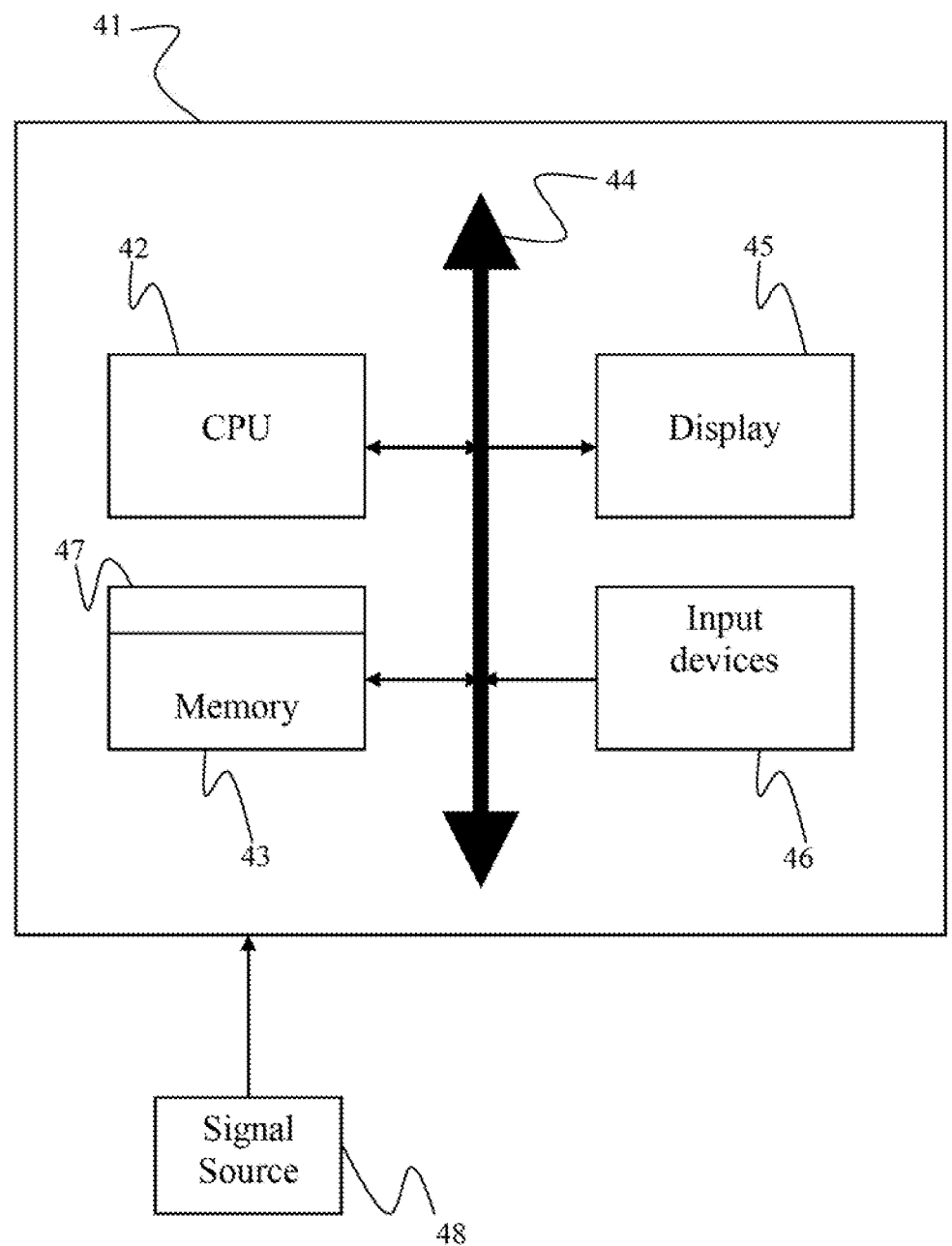
FIG. 4 is a block diagram of a computer system that implements a method for performing division and log operations with a few small tables, according to an embodiment of the disclosure.

FIG. 4 is a block diagram of a system for performing division and log operations with a few small tables, according to an embodiment of the disclosure. Referring now to FIG. 4, a computer system 41 for implementing the present invention can comprise, inter alia, a central processing unit (CPU) or controller 42, a memory 43 and an input/output (I/O) interface 44. The computer system 41 is generally coupled through the I/O interface 44 to a display 45 and various input devices 46 such as a mouse and a keyboard. The support circuits can include circuits such as cache, power supplies, clock circuits, and a communication bus. The memory 43 can include random access memory (RAM), read only memory (ROM), disk drive, tape drive, etc., or a combinations thereof. The present disclosure can be implemented as a routine 47 that is stored in memory 43 and executed by the CPU or controller 42 to process the signal from the signal source 48. As such, the computer system 41 is a general purpose computer system that becomes a specific purpose computer system when executing the routine 47 of the present invention. Alternatively, as described above, embodiments of the present disclosure can be implemented as an ASIC or FPGA 47 that is in signal communication with the CPU or controller 42 to process the signal from the signal source 48.

The computer system 41 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to exemplary embodiments, those skilled in the art will appreciate that various modifications and substitutions can be made thereto without departing from the spirit and scope of the invention as set forth in the appended claims.

What is claimed is:

1. A digital electronic circuit, tangibly embodying a program of instructions executed by the digital electronic circuit to perform method steps for performing division operations in an error correction code, wherein the method steps comprise:
   reading a codeword from a memory device;
   performing error correction on the codeword to generate a corrected codeword; and
   outputting data included in the corrected codeword,
   wherein performing the error correction comprises performing a predetermined operation by using a plurality of tables;
   wherein performing the predetermined operation by using the plurality of tables comprises:
   receiving an output $\omega$ from an error correction code (ECC) algorithm, wherein $\omega \in F \dagger \{0\}$ wherein $F = GF(2^r)$ is a Galois field of $2^r$ elements, $r = 2s$, $r$ and $s$ are integers, $\omega = \Sigma_{0 \le i \le r-1} \beta_i \times \alpha^i$ wherein $\alpha$ is a fixed primitive element of F, and $\beta_i \in GF(2)$, wherein $K = GF(2^s)$ is a subfield of F, and $\{1, \alpha\}$ is a basis of F in a linear subspace of K;
   choosing a primitive element $\delta \in K$, wherein $\omega = \omega_1 + \alpha \times \omega_2$, $\omega_1 = \Sigma_{0 \le i \le s-1} \gamma_i \times \delta^i \in K$, $\omega_2 = \Sigma_{0 \le i \le s-1} \gamma_{i+s} \times \delta^i \in K$, and $\gamma = [\gamma_0, \ldots, \gamma_{r-1}]^T \in GF(2)^r$;
   accessing a first table with $\omega_1$ to obtain $\omega_3 = \omega_1^{-1}$, computing $\omega_2 \times \omega_3$ in field K, when $\omega_1 \ne 0$;
   accessing a second table with $\omega_2 = \omega_3$ to obtain $(1 + \alpha \times \omega_2 \times \omega_3)^{-1} = \omega_4 + \alpha \times \omega_5$, wherein $\omega_4, \omega_5 \in K$, and wherein $\omega^{-1} = (\omega_1 \times (1 + \alpha \times \omega_2 \times \omega_3))^{-1} = \omega_3 \times (\omega_4 + \alpha \times \omega_5) = \omega_3 \times \omega_4 + \alpha \times \omega_3 \times \omega_5$; and computing products $\omega_3 \times \omega_4$ and $\omega_3 \times \omega_5$ to obtain $\omega^{-1} = \Sigma_{0 \le i \le s-1} \theta_i \times \delta^i + \alpha \cdot \Sigma_{i \le i \le s-1} \theta_{i+s} = \delta^i$ where $\theta_i \in GF(2)$).

2. The digital electronic circuit of claim 1, wherein a is of minimal hamming weight.

3. The digital electronic circuit of claim 1, wherein $\delta$ is of minimal hamming weight.

4. The digital electronic circuit of claim 1, wherein the method steps further comprise:
   computing a linear transformation A that transform $\beta = [\beta_0, \ldots, \beta_{r-1}]^T$ of $GF(2)^r$ to $\gamma = A \times \beta = [\gamma_0, \ldots, \gamma_{r-1}]^T$ of $GF(2)^r$ wherein:
   $\beta^* = \Sigma_{0 \le i \le s-1} \gamma_i \times \delta^i + \alpha \cdot \Sigma_{0 \le i \le s-1} \gamma_{i+s} \times \delta^i = \Sigma_{0 \le i \le r-1} \beta_i \times \alpha^i$; and
   applying an inverse linear transformation $A^{-1}$ on $\theta = [\theta_0, \ldots, \theta_{r-1}]^T$ wherein $\lambda = A^{-1} \times \theta = [\lambda_0, \ldots, \lambda_{r-1}]^T \in GF(2)^r$ and $\omega^{-1} = \Sigma_{0 \le i \le r-1} \lambda_i \times \alpha^i$.

5. The digital electronic circuit of claim 4, wherein the linear transformation A is computed offline.

6. The digital electronic circuit of claim 1, wherein the first table is
   $T_1 = \{(\beta, \gamma): \beta = (\beta_0, \ldots, \beta_{s-1}) \in V, \gamma = (\gamma_0, \ldots, \gamma_{s-1}) \in V: \Sigma_{0 \le i \le s-1} \gamma_i \times \delta^i = (\Sigma_{0 \le i \le s-1} \beta_i \times \delta^i)^{-1}\}$, wherein $V = GF(2)^s$, $W = GF(2)^r$ and $\beta$ is an index of an entry that contains $\gamma$, wherein a size of the first table is $s \times 2^s$.

7. The digital electronic circuit of claim 1, wherein the second table is
   $T_2 = \{(\beta, \gamma): \beta = (\beta_0, \ldots, \beta_{s-1}) \in V, \gamma = (\gamma_0, \ldots, \gamma_{r-1}) \in W: \Sigma_{0 \le i \le s-1} \gamma_i \times \delta^i + \alpha \cdot \Sigma_{0 \le i \le s-1} \gamma_{i+s} \times \delta^i = (1 + \alpha \cdot \Sigma_{0 \le i \le s-1} \beta_i \times \delta^i)^{-1}\}$,
   wherein $V = GF(2)^s$, $W = GF(2)^r$ and $\beta$ is an index of an entry that contains $\gamma$, wherein a size of the second table is $r \times 2^s$.

8. The digital electronic circuit of claim 1, wherein the method steps further comprise, when $\omega_1 = 0$,
   accessing the first table with $\omega_2 = \Sigma_{0 \le r \le s-1} \gamma_{i+s} \times \delta^i$ to obtain $\theta = (\theta_0, \ldots, \theta_{x-1}) \in V$ such that $\omega_2^{-1} = \Sigma_{0 \le i \le s-1} \theta_i \times \delta^i$; and
   calculating $\omega^{-1}$ from $\beta \cdot \alpha^{-1} = \Sigma_{0 \le i \le r-1} \beta_i \alpha^{i-1} + \beta_0 \cdot \Sigma_{1 \le i \le \gamma-1} \beta_i + \beta_0 \Sigma_{0 \le i \le r-1} a_{i+1} \cdot \alpha^i$ wherein $\omega^{-1} = \alpha^{-1} \times \omega_2^{-1}$, wherein $a_i$'s are coefficients of a minimal polynomial of $\alpha$ with a minimal Hamming weight, and $\beta$ is an arbitrary element of $F^* = F \setminus \{0\}$.

9. A digital electronic circuit, tangibly embodying a program of instructions executed by the digital electronic circuit to perform method steps for performing log operations in an error correction code, wherein the method steps comprise:
   reading a codeword from a memory device;
   performing error correction on the codeword to generate a corrected codeword; and
   outputting data included in the corrected codeword,
   wherein performing the error correction comprises performing a predetermined operation by using a plurality of tables;
   wherein performing the predetermined operation by using the plurality of tables comprises:
   receiving an output $\omega$ from an error correction code (ECC) algorithm, wherein $\omega = F^* = F \setminus \{0\}$ wherein $F = GF(2^r)$ be a Galois field of $2^r$ elements, $r = 2s$, $r$ and $s$ are integers, $\omega = \Sigma_{0 \le i \le r-1} \beta_i \times \alpha^i$ wherein $\alpha$ is a fixed primitive element of F, and $\beta_i \in GF(2)$, wherein $K = GF(2^s)$ is a subfield of F, and $\{1, \alpha\}$ is a basis of F in a linear subspace of K;
   choosing a primitive element $\delta \in K$, wherein $\omega = \omega_1 + \alpha \times \omega_2$, $\omega_1 = \Sigma_{0 \le i \le s-1} \gamma_i \times \delta^i \in K$, $\omega_2 = \Sigma_{0 \le i \le s-1} \gamma_{i+s} \times \delta^i \in K$, and $\gamma = [\gamma_0, \ldots, \gamma_{r-1}]^T \in GF(2)^r$;
   accessing a first table with $\omega_1$ to obtain $\omega_3 = \omega_1^{-1}$ where $\omega = \omega_1 + \alpha \omega_2$, $\omega_1 = \Sigma_{0 \le i \le s-1} \gamma_i \times \delta^i \in K$, and computing $\omega_2 \times \omega_3$ in field K, when $\omega_1 \ne 0$;

accessing a third table with $\omega_1$ to obtain $\log(\omega_1)$;

accessing a fourth table with $1+\alpha \times \omega_2 \times \omega_3$ to obtain $\log(1+\alpha \times \omega_2 \times \omega_3)$; and computing $\log(\omega)=\log(\omega_1 \times (1+\alpha \times \omega_2 \times \omega_1^{-1}))=\mathrm{mod}(q-1, \log(\omega_1)+\log(1+\alpha \times \omega_2 \times \omega_1^{-1}))$.

10. The digital electronic circuit of claim 9, wherein $\alpha$ is of minimal hamming weight.

11. The digital electronic circuit of claim 9, wherein $\delta$ is of minimal hamming weight.

12. The digital electronic circuit of claim 9, wherein the method steps further comprise computing a linear transformation A that transform $\beta=[\beta_0, \ldots, \beta_{r-1}]^T$ of GF$(2)^r$ to $\gamma=A \times \beta=[\gamma_0, \ldots, \gamma_{r-1}]^T$ pf GF$(2)^r$ wherein:

$\beta^* = \Sigma_{0 \leq i \leq s-1} \gamma_i \times \delta^i + \alpha \cdot \Sigma_{0 \leq i \leq s-1} \gamma_{i+s} \times \delta^i = \Sigma_{0 \leq i \leq r-1} \beta_i \times \alpha^i$.

13. The digital electronic circuit of claim 9, wherein the third table is $T_3=\{(\beta,j): \beta=(\beta_0, \ldots, \beta_{s-1}) \in V, 0 \leq j \leq q-2: j=\log(\Sigma_{0 \leq i \leq s-1} \beta_i \times \delta^i)\}$, wherein $V=GF(2)^s$ and $\beta$ is an index of an entry that contains j, wherein a size of the third table is $r \times 2^s$.

14. The digital electronic circuit of claim 9, wherein the fourth table is $T_4=\{(\beta,j): \beta=(\beta_0, \ldots, \beta_{s-1}) \in \Sigma_{0 \leq i \leq s-1} \gamma_i \times \delta^i, 0 \leq j \leq q-2: j=\log(1\alpha \cdot \Sigma_{0 \leq i \leq s-1} \beta_i \times \delta^i)\}$, wherein $V=GF(2)^s$, and $\beta$ is an index of an entry that contains j, wherein a size of the fourth table is $r \times 2^s$.

15. The digital electronic circuit of claim 9, wherein the method steps further comprise, when $\omega_1=0$, wherein $\omega=\alpha \times \omega_2$;

accessing the third table with $\omega_2$ to obtain $j=\log(\omega_2)$;

calculating $\log(\omega)=\log(\alpha \times \omega_2)=\mathrm{mod}(q-1, 1+j)$, wherein $\log(\alpha)=1$.

16. A digital electronic circuit, tangibly embodying a program of instructions executed by the digital electronic circuit to perform method steps for performing division and log operations in an error correction code, wherein the method steps comprise:

reading a codeword from a memory device;

performing error correction on the codeword to generate a corrected codeword; and outputting data included in the corrected codeword, wherein performing the error correction comprises performing a predetermined operation by using a plurality of tables;

wherein performing the predetermined operation by using the plurality of tables comprises:

receiving an output co from an error correction code (FCC) algorithm, wherein $\omega \in F^*$ wherein $F=GF(2^r)$ be a Galois field of $2^r$ elements, r is an integer, $\omega=\Sigma_{0 \leq i \leq r-1} \beta_i \times \alpha^i$ wherein $\alpha$ is a primitive element of F and $\beta_i \in GF(2)$;

when $\mu(\beta)=0$, wherein $\mu(\beta)=\min \{0 \leq i \leq r-1: \beta_i=1\}$, reading $1/\beta$ from a first table and reading $\log(\beta)$ from a second table.

17. The digital electronic circuit of claim 16, wherein the first table is $T'_1=\{1/\beta: \beta \in F^*$ and $\mu(\beta)=0\}$, wherein a size of the first table is $|F|/2$.

18. The digital electronic circuit of claim 16, wherein the second table is $T'_2=\{\log(\beta): \beta \in F^*\}$ and $\mu(\beta)=0$, wherein a size of the second table is $|F|/2$.

19. The digital electronic circuit of claim 16, wherein performing the error correction further includes: when $\mu(\beta)=s \geq 1$, reading $1/\gamma$ from the first table, wherein $\gamma=\beta/\alpha^s$;

computing $1/\beta$ from $1/\beta=\gamma \cdot \alpha^{-s}$, and computing $\alpha^{-1}$ from $\beta \cdot \alpha^{-1} = \Sigma_{0 \leq i \leq r-1} \beta_i \cdot \alpha^{i-1} = \Sigma_{1 \leq i \leq r-1} \beta_i \cdot \alpha^{i-1} + \beta_0 \cdot \Sigma_{0 \leq i \leq r-1} a_{i+1} \cdot \alpha^i$ wherein $\omega^{-1} = \alpha^{-1} \times \omega_2^{-1}$, wherein $a_i$'s are coefficients of a minimal polynomial of a with a minimal Hamming weight, and $\beta$ is an arbitrary element of $F^*=F \backslash \{0\}$.

20. The digital electronic circuit of claim 16, wherein performing the error correction further includes: when $\mu(\beta)=s \geq 1$, reading $\log(\gamma)$ from the second table, wherein $\gamma=\beta/\alpha^s$, and calculating $\log(\beta)=\mathrm{mod}(q-1, s+\log(\gamma))$.

\* \* \* \* \*